United States Patent
Cruz et al.

(10) Patent No.: US 10,317,965 B2
(45) Date of Patent: Jun. 11, 2019

(54) APPARATUSES AND METHODS FOR ENCAPSULATED DEVICES

(71) Applicant: Intersil Americas LLC, Milpitas, CA (US)

(72) Inventors: Randolph Cruz, Melbourne, FL (US); Loyde M. Carpenter, Jr., Palm Bay, FL (US); Mark A. Kwoka, Palm Bay, FL (US)

(73) Assignee: INTERSIL AMERICAS LLC, Milpitas, CA (US)

(*) Notice: Subject to any disclaimer, the term of this patent is extended or adjusted under 35 U.S.C. 154(b) by 469 days.

(21) Appl. No.: 15/045,630

(22) Filed: Feb. 17, 2016

(65) Prior Publication Data

US 2017/0077807 A1 Mar. 16, 2017

Related U.S. Application Data

(60) Provisional application No. 62/218,687, filed on Sep. 15, 2015, provisional application No. 62/242,447, filed on Oct. 16, 2015.

(51) Int. Cl.
*H01F 27/02* (2006.01)
*H01L 21/56* (2006.01)
*H01L 23/31* (2006.01)
*G06F 1/26* (2006.01)
*H02M 7/00* (2006.01)

(52) U.S. Cl.
CPC ............ *G06F 1/26* (2013.01); *H01F 27/022* (2013.01); *H01L 21/56* (2013.01); *H01L 21/565* (2013.01); *H01L 23/3135* (2013.01); *H01L 23/3142* (2013.01); *H02M 7/003* (2013.01)

(58) Field of Classification Search
CPC ..... H01F 27/022; H01L 21/56; H01L 21/565; H01L 23/3142; H01L 23/3135
USPC ........................................ 257/787
See application file for complete search history.

(56) References Cited

U.S. PATENT DOCUMENTS

| | | | |
|---|---|---|---|
| 7,795,710 B2 | 9/2010 | Islam et al. | |
| 8,551,820 B1 | 10/2013 | Foster et al. | |
| 8,779,568 B2 | 7/2014 | Do et al. | |
| 8,871,572 B2 | 10/2014 | Cruz et al. | |
| 2006/0072296 A1* | 4/2006 | Mays | H01L 23/367 361/760 |
| 2008/0122067 A1* | 5/2008 | Wang | H01L 23/4334 257/706 |
| 2010/0164079 A1* | 7/2010 | Dekker | H01L 21/4846 257/676 |

OTHER PUBLICATIONS

Sung Yeul Park, Printed Circuit Board Design, powerpoint presentation, Dept. of Electrical and Computer Eng, University of Connecticut, Sep. 24, 2014.

(Continued)

*Primary Examiner* — Elias Ullah
(74) *Attorney, Agent, or Firm* — Foley & Lardner LLP

(57) ABSTRACT

One embodiment is directed towards an encapsulated device. The encapsulated device includes a device, and a first encapsulation covering the device. The first encapsulation has one or more exterior surfaces. One or more recesses in one or more of the exterior surfaces is configured to receive a second encapsulation.

16 Claims, 7 Drawing Sheets

(56) References Cited

OTHER PUBLICATIONS

Tony Garramone, How to Build a Printed Circuit Board, Advanced Circuits Inc. Jan. 12, 2007.
Randolph Cruz, "Systems and Methods for Substrates", U.S. Appl. No. 15/045,598, filed Feb. 17, 2016, pp. 1-13.
Randolph Cruz, "Systems and Methods for Substrates", U.S. Appl. No. 15/045,598, filed Feb. 17, 2016, Drawings pp. 1-11.
APSi, Molded Interconnect Substrate, http://www.advanpack.com/MIS.html, 2 pages.
Molded interconnect device, https://en.wikipedia.org/wiki/Molded_interconnect_device, 3 pages.
MacDermid Electronic Solutions, Molded Interconnect Devices, http://electronics.masdermid.com/cms/applications/molded-intersonnect-devices/index.shtml, 1 page.
QDOS, Molded Interconnect Substrate (MIS), http://www.qdos.com.my/portfolio.php, 10 pages.

\* cited by examiner

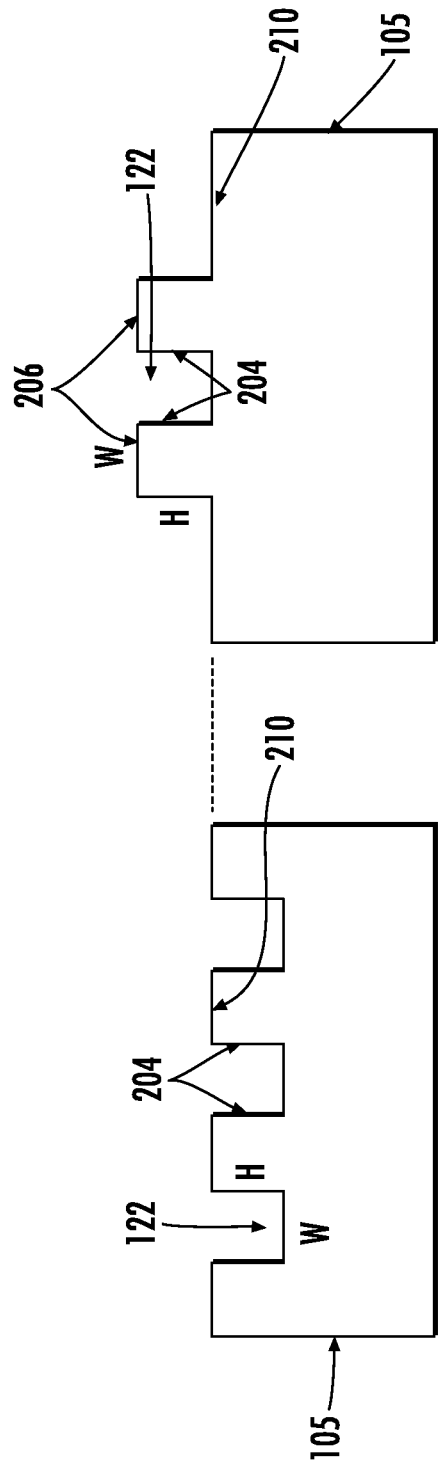

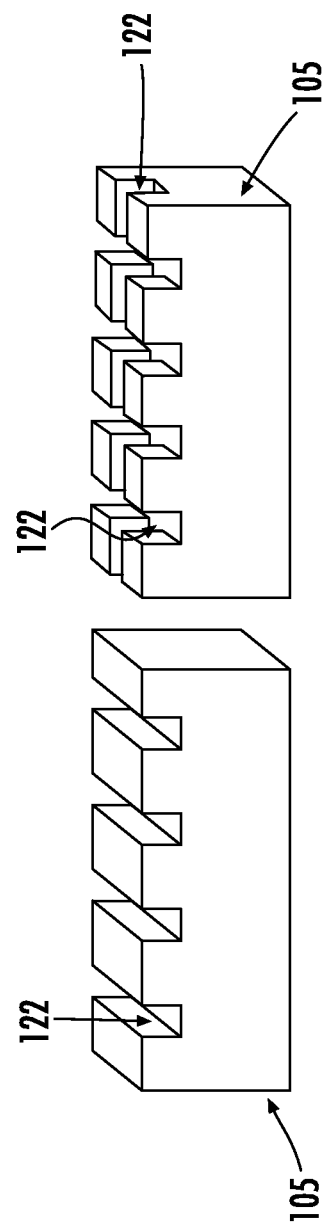

APPARATUSES AND METHODS FOR ENCAPSULATED DEVICES

CROSS-REFERENCED TO RELATED APPLICATION

This application claims the benefit of provisional U.S. Patent Application Ser. No. 62/218,687 filed Sep. 15, 2015 and provisional U.S. Patent Application Ser. No. 62/242,447 filed Oct. 16, 2015, both of which are incorporated herein by reference in their entirety.

BRIEF DESCRIPTION OF THE DRAWINGS

FIG. 2A is a cross-sectional view of an embodiment of recesses in the device encapsulation.

FIG. 2B is a cross-sectional view of another embodiment of recesses in the device encapsulation.

FIG. 3A is a perspective view of an embodiment of multiple recesses that are parallel along one axis.

FIG. 3B is a perspective view of an embodiment of multiple parallel recesses in one axis, and a single recess along a perpendicular axis.

DESCRIPTION OF THE EMBODIMENTS

Figure 1A:
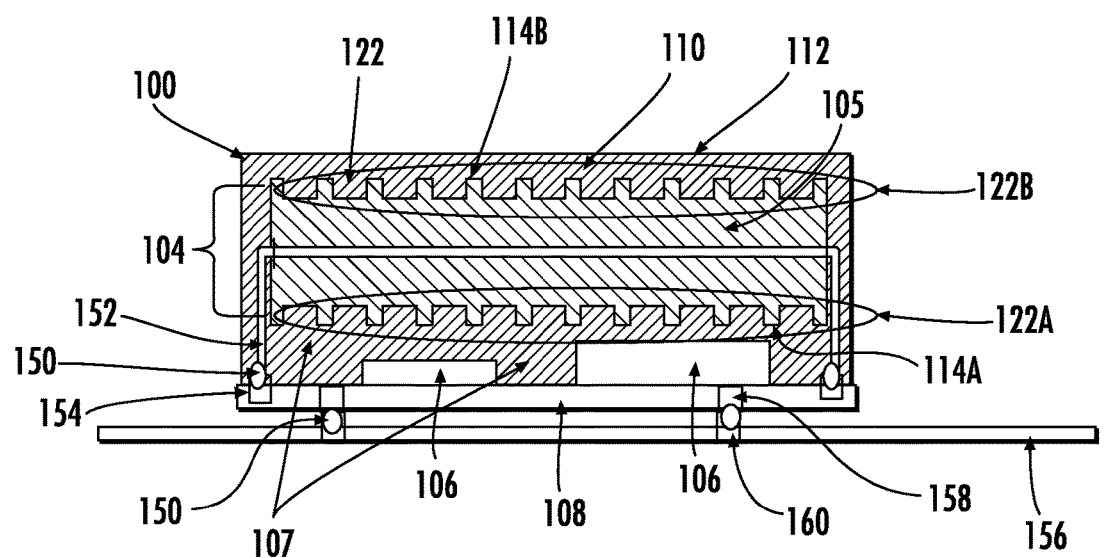
FIG. 1A is a cross-sectional view of an embodiment of an encapsulated component including an encapsulated device and un-encapsulated devices.

Devices encapsulated, e.g. with a plastic such a thermoset material, such as epoxy molding compound (EMC), or a thermoplastic material, and formed by encapsulation molding, are used in systems such as electrical systems. The device may be encapsulated to protect it from the environment, and protect its mechanical and electrical integrity. In one embodiment, device terminals would not be encapsulated to facilitate connection to other item(s).

A device may be an active device, such as an integrated circuit (IC), a transistor, or another active semiconductor device. A device may also be a passive device, such as an inductor, capacitor, or a mechanical device such as an accelerometer. A device may have conductive terminals that are leaded or leadless.

A component is formed when one or more devices are mounted on a mounting structure. Mounting structures include carriers, lead frames, substrates, and printed circuit boards (PCBs). The mounting structure may have terminals that are leaded or leadless. A component may be mounted on another mounting structure, e.g. such as mounting a component (such as a device on a carrier) on a PCB. The component may also be encapsulated (as, and for the same reasons, described above).

When mounting an encapsulated device on a mounting structure, a gap is formed between the encapsulated device and mounting structure. (The mounting structure may be used to make a System-in-Package or a Multichip module.) Because of system miniaturization requirements, the gap is relatively narrow compared to the dimensions of the component to be encapsulated. It is difficult to vent and remove trapped air and volatile gases from molten component encapsulation, e.g. molten thermoset material, such as molten EMC, or a molten thermoplastic material from a closed mold so that the molten material fills the gap.

There is an increased risk of forming one or more void(s), i.e. pockets of air and/or volatile gases, surrounded by encapsulation, in the gap during component encapsulation. Such void(s) increase the thermal mechanical mismatch and create interfacial stresses between the encapsulations of the device and component. This may cause localized stress concentration points, which could induce interfacial material delamination and cracks. In addition, moisture could collect in the void(s); during subsequent thermal cycling, the hydrostatic pressure of the moisture could induce delamination of the component encapsulation where it adjoins the mounting structure and/or device encapsulation. The hydrostatic pressure may also cause cracks in the component and/or device encapsulation. Thus, such void(s) undesirably reduce encapsulated component reliability.

Further, depending on the shape and size of the encapsulated device, any differences in thermal mechanical properties between that device encapsulation and the component encapsulation, interfacial stresses may be induced in one or both of those materials. For example, stresses may be created in the component encapsulation, e.g. in the encapsulation cap. This may result in deformation of and/or cracking in (possibly leading to delaminating of) the component encapsulation cap. Such deformation and/or cracking would also undesirably reduce the reliability of the packaged component.

Interfacial stress can be reduced by increasing the contact surface area at an interface. To reduce the risk of forming deformations, cracks and void(s), one or more recesses can be formed in one or more surfaces of the device encapsulation. FIG. 1A illustrates one embodiment of the present invention, an encapsulated component 100 including an encapsulated device 104, and un-encapsulated devices 106. The encapsulated devices 104 and the un-encapsulated devices 106 are mounted on a mounting structure 108. The encapsulated devices 104, the un-encapsulated devices 106 and mounting structure 108 are covered by component encapsulation 110. The encapsulated device 104 is covered with device encapsulation 105.

Recesses 122 are formed in the device encapsulation 105. The set of recesses 122A (in the encapsulated device's bottom surface 114A, which is closest and substantially parallel to mounting structure 108), facilitates the venting of the component encapsulation 110 throughout the gap 107. In FIG. 1A, the gap 107 is more specifically formed by exposed regions of the mounting structure 108 and un-encapsulated devices 106, all under the encapsulated device 104.

The set of recesses 122B (in the encapsulated device's top surface 114B that is closest and substantially parallel to the top surface 112 of the encapsulated component 100) facilitates the elimination of delamination and cracking, e.g., about the top surface 112.

Figure 1B:
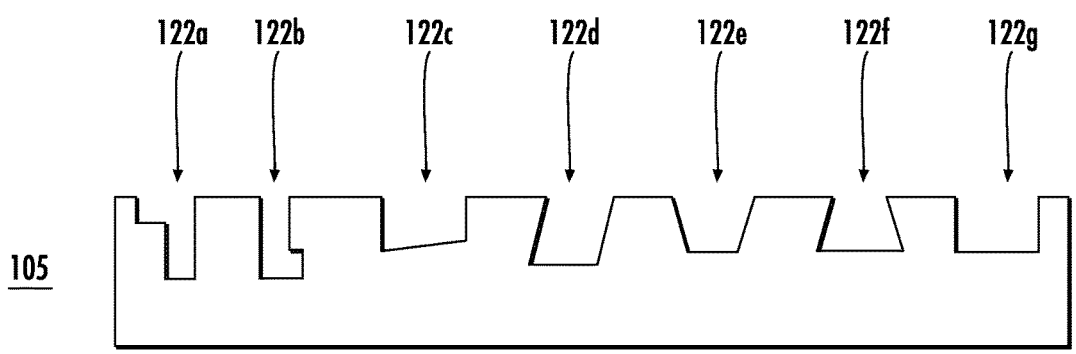
FIG. 1B are cross-sectional views of embodiments of recesses.

The recess(es) 122 serve also to interlock the device encapsulation 105 and the component encapsulation 110, thus enhancing the mechanical integrity and reliability of the encapsulated component 100. Such interlocking improves the adhesion between the device encapsulation 105 and the component encapsulation 110. Exemplary recess profiles are illustrated in FIG. 1B, and include an inverted L shape recess 122a, L shape recess 122b, quadrilateral shape recess 122c, parallelogram shape recess 122d, inverted trapezoid shape recess 122e, trapezoid shape recess 122f, and a rectangular shape recess 122g. Shapes such as the L shape recess 122b, parallelogram shape recess 122d, and trapezoid shape recess 122f, enhance, due to their shape, increase the interlocking strength and reduce the interfacial stress between the component encapsulation 110 and the device encapsulation 105.

The dimensions of a recess 122 are dependent upon the technique used to form the recess, the dimensions of the device encapsulation 105, the dimensions needed to facilitate venting, and the number of recesses 122 required to enhance adhesion between the device encapsulation 105 and the component encapsulation 110. In one embodiment, the height and width of a recess 122 are each greater than or equal to fifty microns. In another embodiment, the ratio of the width of a recess 122 to the width of an encapsulated device 104 is between one percent and twenty five percent. The width of the encapsulated device 104 would be in the same dimension as the width of the corresponding recess 122. In yet another embodiment, the ratio of the width of the recess 122 to the height of the recess 122 is between fifty and one hundred percent.

FIG. 2A illustrates exemplary recesses 122 in the device encapsulation 105. Each recess 122 is formed by two sidewalls 204 extending below a nominal exterior surface 210 of the device encapsulation 105. FIG. 2B illustrates another exemplary recess 122 above the nominal exterior surface 210 of the device encapsulation 105. The recess 122 is formed by protrusions 206 having sidewalls 204 extending above the nominal exterior surface 210 of the device encapsulation 105.

In one embodiment, the recess(es) 122 in the device encapsulation 105 may be formed along one or more axes. In another embodiment, two or more recesses 122 may be skewed from one another at any angle, e.g. from zero to one hundred and eighty degrees; in one embodiment the recesses are skewed at ninety degrees. FIG. 3A illustrates an embodiment with multiple recesses 122 that are parallel along one axis; such exemplary recesses extend through one axis of the device encapsulation 105. FIG. 3B illustrates yet another embodiment with multiple parallel recesses 122 in one axis, and a single recess 122 along a perpendicular axis.

Figure 4:
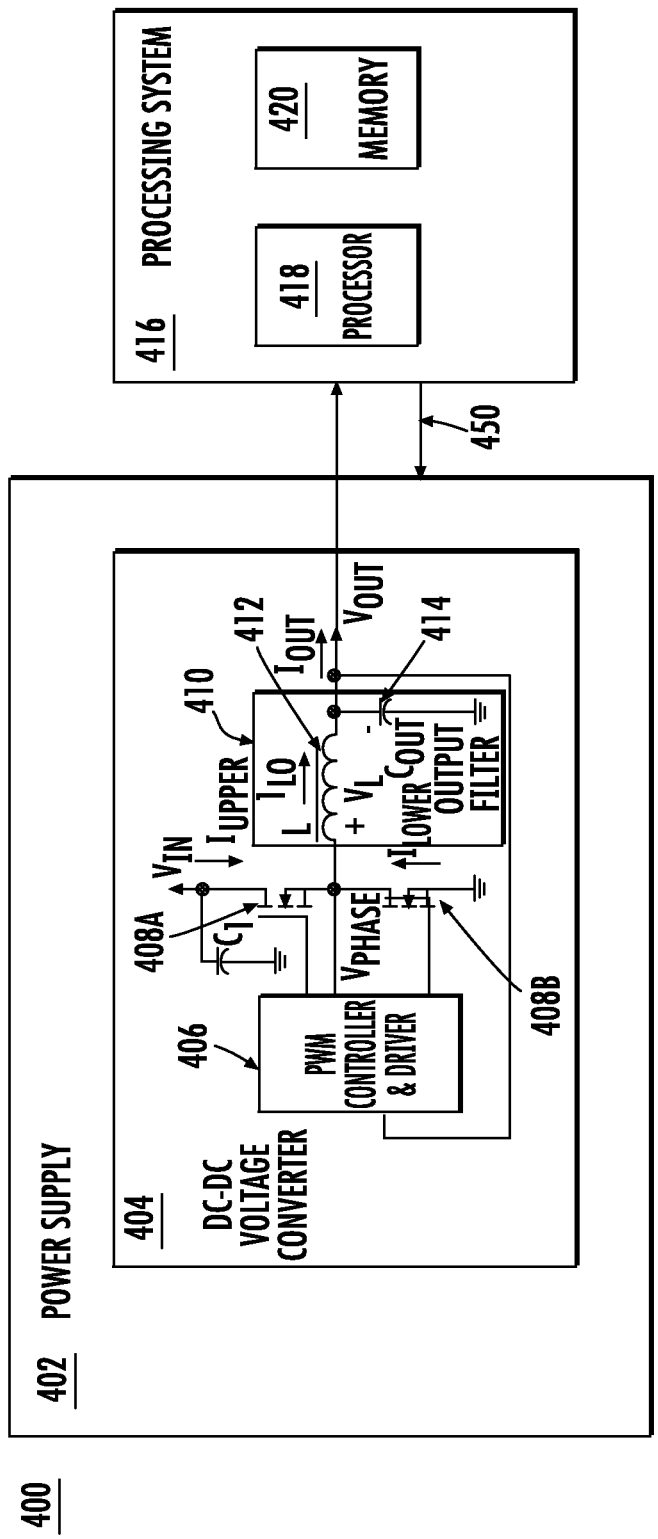
FIG. 4 is an illustration of one embodiment of an electrical system.

An encapsulated component 100, in one embodiment, may be used to implement all or part of a DC-DC voltage converter (e.g. buck converter, a boost converter, a buck-boost converter, or a synchronous buck converter). FIG. 4 illustrates an exemplary electrical system 400 comprising a load, e.g. a processing system 416, and power supply 402 that includes a DC-DC voltage converter 404 fabricated, for example, as an encapsulated component like encapsulated component 100 of FIG. 1A. In one embodiment, the processing system 416 is configured to be electrically coupled to the DC-DC voltage converter 404 to receive DC power. In another embodiment, the DC-DC voltage converter 404 and processing system 416 are configured to be coupled to one another through a data bus 450, which facilitates communications between them; this permits the processing system 416 to control the DC-DC voltage converter 404. This electrical system 400 may be a device related to telecommunications, automobiles, semiconductor test and manufacturing equipment, consumer electronics, or any type of electronic equipment.

The power supply 402 may be an AC to DC power supply, or a DC supply powered by a battery. In one embodiment, the processing system 416 may include a processor 418 and a memory 420 which are coupled to one another. In another embodiment, the processor 418 may be one or more microprocessors, microcontrollers, embedded processors, digital signal processors, or a combination of two or more of the foregoing. In yet another embodiment, the memory 420 may be one or more volatile memories and/or non-volatile memories (such as static random access memory, dynamic random access memory, read only memory, and flash memory), or a combination of two or more of the foregoing.

In one embodiment, illustrated in FIG. 4, the DC-DC voltage converter 404 includes a pulse width modulation ('PWM') controller and driver 406, power transistors, e.g. upper metal oxide semiconductor field effect transistor ('MOSFET') 408A and a lower MOSFET 408B, and an output filter 410. The PWM controller and driver 406 cause the upper MOSFET 408A and the lower MOSFET 408B to alternatively switch on and off. In another embodiment, the controller and driver 406 may include dead time control. The output filter 410 includes, e.g., a series inductor 412 and shunt capacitor 414. The PWM controller and driver 406, power transistors, and output filter 410 (or its inductor 412 and capacitor 414 constituents separately) may be implemented as one or more encapsulated and/or unencapsulated devices in the encapsulated component 100.

In one embodiment, the PWM controller and driver 406 are fabricated on a single IC. Alternatively, the PWM controller and driver 406 may be fabricated on separate ICs. In a further embodiment, the upper MOSFET 408A and the lower MOSFET 408B may be fabricated on a single IC. In yet another embodiment, the upper MOSFET 408A and lower MOSFET 408B may be fabricated on the same IC as the PWM controller and driver 406.

In other examples, an encapsulated component 100 would include one or more components of other power management systems, including all or part of a charger, a hot-swap controller, an AC-DC converter, or a bridge driver.

Figure 5:
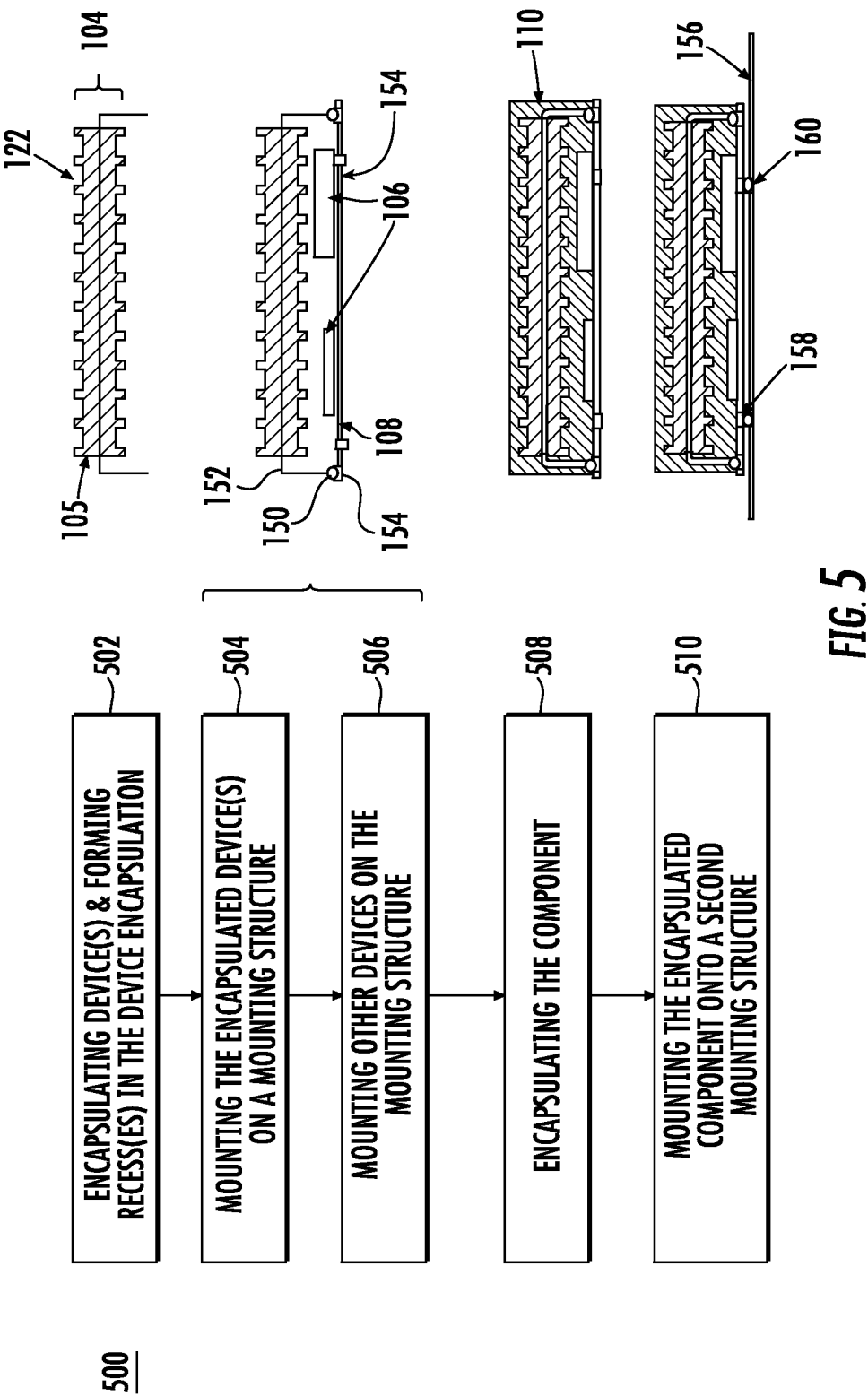
FIG. 5 is an illustration of one embodiment of a method of manufacturing an encapsulated device and an encapsulated component, and then mounting the encapsulated component on a mounting structure.

FIG. 5 illustrates an exemplary method 500 of manufacturing the previously described encapsulated component 100 and encapsulated device 104, and then mounting the encapsulated component 100 on a second mounting structure. In block 502, one or more encapsulated device(s) 104 are formed (as will be further described below). In one embodiment, the recesses 122 are formed when the device(s) are covered in device encapsulation 105, e.g. using encapsulation molding, such as injection molding, with a thermoset material, such as EMC, or a thermoplastic material. The mold may be designed to form either the recesses 122 and/or protrusions 206 illustrated respectively in FIGS. 2A and 2B.

In another embodiment, the device(s) are first covered with device encapsulation 105. One or more recesses 122 are then subsequently formed in each encapsulated device 104 by removing portions of device encapsulation 105. Device encapsulation 105 removal can be achieved, e.g., by photolithography and chemical etching, laser ablation, mechanical removal such as by sawing, or any combination thereof.

In one embodiment, in block 504, encapsulated device(s) 104 are mounted on each of one or more mounting structures 108. Returning to FIG. 1A, in one embodiment, encapsulated device terminal(s) 152 are electrically coupled, e.g. with solder 150, to mounting structure terminal(s) 154.

In optional block 506, other encapsulated devices 104 and/or un-encapsulated device(s) 106 are mounted onto the mounting structure(s) 108. Depending upon the location of the un-encapsulated devices 106, such un-encapsulated devices 106 may have to be mounted prior to mounting the encapsulated devices 104 in block 504. For example, if an un-encapsulated device 106 is mounted under an encapsulated device 104, the un-encapsulated device 106 would be mounted prior to mounting the encapsulated device 104. In one embodiment, these other devices are mounted onto the mounting structure(s) 108 in the same manner that the encapsulated device(s) 104 are mounted to the mounting structure(s) 108 (as described above).

In block 508, the device(s) and mounting substructure(s) 108 are covered with component encapsulation 110 (for example in a manner described above for encapsulating a device). In block 510, the encapsulated component(s) 100 are mounted on second mounting structure(s) 156 (as illustrated in FIG. 1A). In one embodiment, the encapsulated component(s) 100 may be mounted onto the second mounting structure(s) 156 in the same manner as the encapsulated device(s) 104 are mounted onto the mounting structure(s) (as described above), e.g. electrically coupling encapsulated component terminals 158 with solder 150 to second mounting structure terminals 160.

Figure 6:
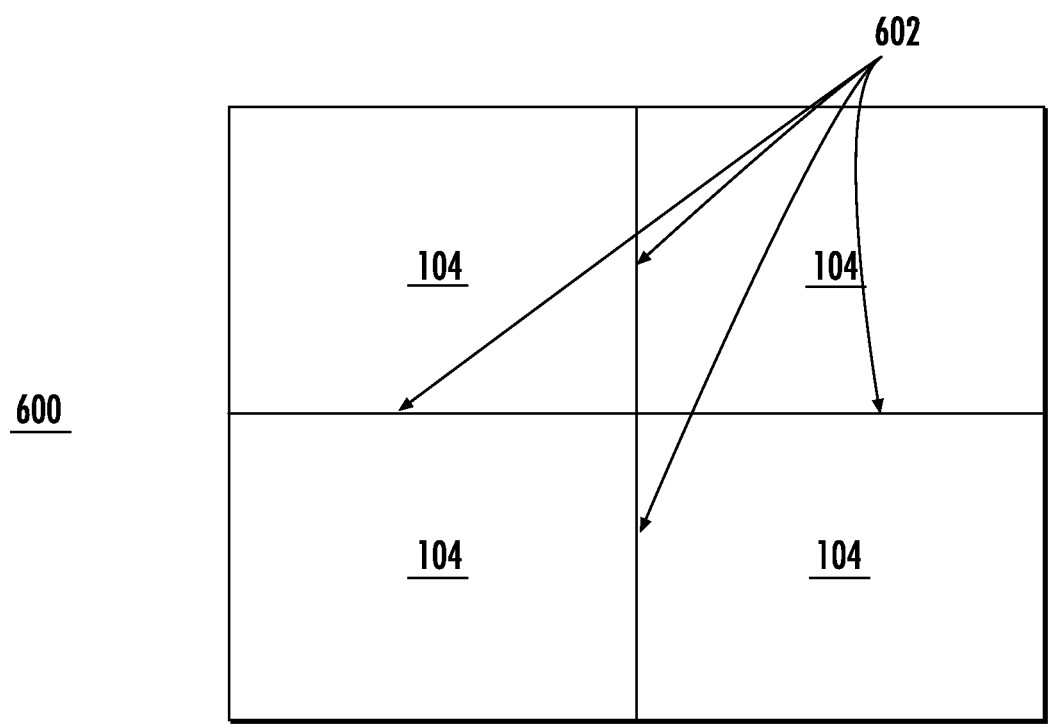
FIG. 6 illustrates one embodiment of an array of encapsulated components attached to one another by connecting pieces.

Manufacturing an encapsulated device 104 and/or encapsulated components 100 may be undertaken when contemporaneously manufacturing a plurality of respectively encapsulated devices 104 and/or encapsulated components 100. Accordingly, a plurality encapsulated devices 104 can be made adjacent to one another. As illustrated in FIG. 6, in one embodiment, the encapsulated components 100 can be fabricated in an array 600 and are attached by connecting pieces 602, such as a kerf. Once assembled, the encapsulated devices 104 can be singulated, e.g. after block 502, by substantially eliminating the connecting pieces 602 such as by sawing. Similarly, a plurality of encapsulated components 100 can be manufactured together as illustrated for the encapsulated component 100 above. The encapsulated components 100 may be fabricated in an array 600, and singulated, e.g. after block 508, for example, in the manner described above. Thus, in one embodiment, block 502 described above may include the formation of more than one encapsulated device 104 and recess(es) 122 therein. In another embodiment block 502 also includes the singulation, e.g. by kerf removal by sawing, of an array 600 of encapsulated devices 104 with recess(es) 122 therein.

A number of examples defined by the following claims have been described. Nevertheless, it will be understood that various modifications to the described examples may be made without departing from scope of the claimed invention. Features and aspects of particular examples described herein can be combined with or replace features and aspects of other examples. Accordingly, other examples are within the scope of the following claims.

EXAMPLE EMBODIMENTS

Example 1 includes an encapsulated device, comprising: a device; a first encapsulation, covering the device, having one or more exterior surfaces; and one or more recesses, in the one or more of the exterior surfaces, configured to receive a second encapsulation.

Example 2 includes the encapsulated device of Example 1, where the one or more recesses are on opposite surfaces of the first encapsulation.

Example 3 includes the encapsulated device of Example 1, where the first encapsulation is one of a thermoset material or a thermoplastic material.

Example 4 includes the encapsulated device of Example 1, where the second encapsulation is one of a thermoset material or a thermoplastic material.

Example 5 includes the encapsulated device of Example 1, where the device is an inductor.

Example 6 includes the encapsulated device of Example 1, where a height and a width of at least one of the one or more recesses are each greater than or equal to fifty microns.

Example 7 includes the encapsulated device of Example 1, where a ratio of a width of at least one of the one or more recesses to the height of the at least one of the one or more recesses is between fifty and one hundred percent.

Example 8 includes the encapsulated device of Example 1, wherein the one or more recesses are one of an L shape recess, a parallelogram shape recess, and a trapezoid shape recess.

Example 9 includes an encapsulated component, comprising: one or more encapsulated devices covered by a first encapsulation; wherein each encapsulated device has an exterior surface on the first encapsulation; one or more recesses in at least one of the exterior surfaces; and a second encapsulation material covering the one or more encapsulated devices substantially filling one or more recesses of at least one of the encapsulated devices.

Example 10 includes the encapsulated component of Example 9, further comprising: a mounting structure to which the encapsulated device is attached; a gap between the encapsulated device and the mounting structure; and wherein the second encapsulation material substantially fills the gap.

Example 11 includes the encapsulated component of Example 9, wherein the first encapsulation is one of a thermoset material or a thermoplastic material.

Example 12 includes the encapsulated component of Example 9, wherein the second encapsulation is one of a thermoset material or a thermoplastic material.

Example 13 includes the encapsulated component of Example 9, where a ratio of a width of one of the one or more recesses in the exterior surface of that one encapsulated device to a width of that encapsulated device is between one percent and twenty-five percent.

Example 14 includes the encapsulated component of Example 9, where a height and a width of one of the at least one of the one or more recesses are each greater than or equal to fifty microns.

Example 15 includes the encapsulated component of Example 9, where a ratio of a width of one of the one or more recesses to a height of that one recess is between fifty and one hundred percent.

Example 16 includes the encapsulated device of Example 9, wherein one of the recesses is one of an L shape recess, a parallelogram shape recess, and a trapezoid shape recess.

Example 17 includes the encapsulated component of Example 9, wherein at least one of the encapsulated devices is one of an inductor, a PWM controller and driver, a capacitor, and at least one power transistor.

Example 18 includes the encapsulated component of Example 10, wherein the encapsulated component is a DC-DC voltage converter including: a PWM controller and driver; at least one power transistor coupled to outputs of the PWM controller and driver; and an output filter coupled to the at least one power transistor.

Example 19 includes the encapsulated component of Example 18, wherein the output of the DC-DC voltage converter is coupled to a processing system.

Example 20 includes the encapsulated component of Example 19, wherein the processing system comprises a processor coupled to a memory.

Example 21 includes a method, comprising: encapsulating a device with a first encapsulation to form an encapsulated device; and forming recesses on one or more surfaces of the first encapsulation configured to receive a subsequently deposited second encapsulation which would cover the encapsulated device.

Example 22 includes the method of Example 20, further comprising mounting the encapsulated device on a mounting structure.

Example 23 includes the method of Example 20, further comprising mounting one or more additional encapsulated or un-encapsulated devices on a mounting structure.

Example 24 includes the method of claim 20, further comprising covering the encapsulated device and a mounting structure with the second encapsulation, substantially filling at least one of the recesses.

The invention claimed is:

1. An encapsulated device, comprising:
   a device;
   a first encapsulation, covering the device, having one or more exterior surfaces; and
   one or more recesses, in the one or more of the exterior surfaces, configured to receive a second encapsulation, wherein the second encapsulation is one of a thermoset material or a thermoplastic material,
   where a ratio of a width of at least one of the one or more recesses to a height of the at least one of the one or more recesses is between fifty and one hundred percent.

2. The encapsulated device of claim 1, where the one or more recesses are on opposite surfaces of the first encapsulation.

3. The encapsulated device of claim 1, where the first encapsulation is one of a thermoset material or a thermoplastic material.

4. The encapsulated device of claim 1, where the device is an inductor.

5. The encapsulated device of claim 1, where a height and a width of at least one of the one or more recesses are each greater than or equal to fifty microns.

6. The encapsulated device of claim 1, wherein the one or more recesses are one of an L shape recess, a parallelogram shape recess, and a trapezoid shape recess.

7. An encapsulated component, comprising:
   one or more encapsulated devices covered by a first encapsulation;
   wherein each encapsulated device has an exterior surface on the first encapsulation;
   one or more recesses in at least one of the exterior surfaces; and
   a second encapsulation covering the one or more encapsulated devices substantially filling one or more recesses of at least one of the encapsulated devices, wherein the second encapsulation is a thermoplastic material,
   where a ratio of a width of one of the one or more recesses in the exterior surface of that one encapsulated device to a width of that encapsulated device is between one percent and twenty-five percent.

8. The encapsulated component of claim 7, wherein the first encapsulation is one of a thermoset material or a thermoplastic material.

9. The encapsulated component of claim 7, where a height and a width of one of the at least one of the one or more recesses are each greater than or equal to fifty microns.

10. The encapsulated component of claim 7, where a ratio of a width of one of the one or more recesses to a height of that one recess is between fifty and one hundred percent.

11. The encapsulated component of claim 7, wherein one of the one or more recesses is one of an L shape recess, a parallelogram shape recess, and a trapezoid shape recess.

12. The encapsulated component of claim 7, wherein at least one of the encapsulated devices is one of an inductor, a PWM controller and driver, a capacitor, and at least one power transistor.

13. An encapsulated component, comprising:
   one or more encapsulated devices covered by a first encapsulation;
   wherein each encapsulated device has an exterior surface on the first encapsulation;
   one or more recesses in at least one of the exterior surfaces;
   a second encapsulation covering the one or more encapsulated devices substantially filling one or more recesses of at least one of the encapsulated device;
   a mounting structure to which the encapsulated device is attached;
   a gap between the encapsulated device and the mounting structure; and
   wherein the second encapsulation substantially fills the gap.

14. The encapsulated component of claim 13, wherein the encapsulated component is a DC-DC voltage converter including:
   a PWM controller and driver;
   at least one power transistor coupled to outputs of the PWM controller and driver; and
   an output filter coupled to the at least one power transistor.

15. The encapsulated component of claim 14, wherein an output of the DC-DC voltage converter is coupled to a processing system.

16. The encapsulated component of claim 15, wherein the processing system comprises a processor coupled to a memory.

* * * * *